(12) United States Patent
Chorley et al.

(10) Patent No.: US 11,551,841 B2
(45) Date of Patent: Jan. 10, 2023

(54) THERMAL BUSES FOR CRYOGENIC APPLICATIONS

(71) Applicant: Siemens Healthcare Limited, Camberley (GB)

(72) Inventors: Simon Chorley, Oxford (GB); Martin Howard Hempstead, Ducklington (GB); Michael Simpkins, Chipping Norton (GB)

(73) Assignee: Siemens Healthcare Limited, Cambereley (GB)

( * ) Notice: Subject to any disclaimer, the term of this patent is extended or adjusted under 35 U.S.C. 154(b) by 656 days.

(21) Appl. No.: 16/658,547

(22) Filed: Oct. 21, 2019

(65) Prior Publication Data

US 2021/0074457 A1 Mar. 11, 2021

(30) Foreign Application Priority Data

Oct. 22, 2018 (GB) ...................................... 1817190

(51) Int. Cl.
| | | |
|---|---|---|
| *H01F 6/04* | (2006.01) | |
| *F25D 19/00* | (2006.01) | |
| *G01R 33/38* | (2006.01) | |

(52) U.S. Cl.
CPC ............. *H01F 6/04* (2013.01); *F25D 19/006* (2013.01); *G01R 33/3804* (2013.01)

(58) Field of Classification Search
CPC ...... H01F 6/04; F25D 19/006; G01R 33/3804
See application file for complete search history.

(56) References Cited

U.S. PATENT DOCUMENTS

| | | |
|---|---|---|
| 3,801,942 A | 4/1974 | Elsel |
| 4,986,078 A | 1/1991 | Laskaris |
| 5,093,645 A | 3/1992 | Dorri et al. |
| 5,394,129 A | 2/1995 | Obasih et al. |
| 5,917,393 A | 6/1999 | Kupiszewski et al. |
| 6,081,179 A | 6/2000 | Kato |
| 2006/0116293 A1 | 6/2006 | Norton et al. |
| 2008/0079323 A1 | 4/2008 | Zhang |
| 2010/0085137 A1 | 4/2010 | Baker et al. |
| 2010/0254345 A1 | 10/2010 | Raravi et al. |
| 2010/0313574 A1 | 12/2010 | Koyanagi et al. |
| 2018/0144851 A1 | 5/2018 | Li et al. |

FOREIGN PATENT DOCUMENTS

| | | |
|---|---|---|
| CN | 1202709 A | 12/1998 |
| CN | 1470096 A | 1/2004 |
| CN | 101221848 A | 7/2008 |

(Continued)

OTHER PUBLICATIONS

Office Action dated May 6, 2021 for Chinese Patent Application No. 2019110011611.

*Primary Examiner* — Ramon M Barrera
(74) *Attorney, Agent, or Firm* — Banner & Witcoff Ltd.

(57) ABSTRACT

A superconducting magnet device including a plurality of superconducting magnet coils; a structural element mechanically and thermally linked to respective magnet coils to retain them in respective relative positions; and a cooling station thermally connected to a cryogenic refrigerator and to the structural element. A thermally conductive path, which passes through the structural element, is established between the cryogenic refrigerator and the superconducting magnet coils through the structural element.

15 Claims, 3 Drawing Sheets

(56) References Cited

FOREIGN PATENT DOCUMENTS

| EP | 0470762 A1 | 2/1992 |
|----|------------|--------|
| GB | 1101652 A | 1/1968 |
| JP | H07142241 A | 6/1995 |
| JP | H11176629 A | 7/1999 |
| JP | H11199367 A | 7/1999 |
| JP | 2000312036 A | 11/2000 |
| JP | 2001110627 A | 4/2001 |
| JP | 2010272745 A | 12/2010 |
| NZ | 591917 A | 12/2012 |

THERMAL BUSES FOR CRYOGENIC APPLICATIONS

BACKGROUND

The present disclosure relates to thermal buses for cryogenic applications, in particular to thermal buses which also perform a structural or secondary function yet provide an effective cooling path at a reasonable cost.

FIG. 1 shows a known arrangement of a cryostat including a cryogen vessel 12. A cooled superconducting magnet 10 is provided within cryogen vessel 12, itself retained within an outer vacuum chamber (OVC) 14. One or more thermal radiation shields 16 are provided in the vacuum space between the cryogen vessel 12 and the outer vacuum chamber 14. In some known arrangements, a refrigerator 17 is mounted in a refrigerator sock 15 located in a turret 18 provided for the purpose, towards the side of the cryostat. Alternatively, a refrigerator 17 may be located within access turret 19, which retains access neck (vent tube) 20 mounted at the top of the cryostat. The refrigerator 17 provides active refrigeration to cool cryogen gas within the cryogen vessel 12, in some arrangements by recondensing it into a liquid. The refrigerator 17 may also serve to cool the radiation shield 16. As illustrated in FIG. 1, the refrigerator 17 may be a two-stage refrigerator. A first cooling stage is thermally linked to the radiation shield 16, and provides cooling to a first temperature, typically in the region of 40-100K. A second cooling stage provides cooling of the cryogen gas to a much lower temperature, typically in the region of 4-10K.

A negative electrical connection 21a is usually provided to the magnet 10 through the body of the cryostat. A positive electrical connection 21 is usually provided by a conductor passing through the vent tube 20.

The known arrangement depicted in FIG. 1 is an example of a 'wet' magnet, in which the magnet coils are cooled by contact with a liquid cryogen material held at its boiling point.

One current aim of cryogenic device developers, including the developers of MRI magnets, is to minimise total costs by reducing the amount of liquid cryogen required by the device or removing it entirely, to produce a 'dry' system.

Such a reduction in the liquid cryogen requirement reduces the costs for the initial cryogen fill on installation of a system, but also reduces lifetime system costs, including liquid cryogen consumption on system refills during service, top ups, recovery from quenches; and other costs which may be avoided in a 'dry' system, such as system installation costs to provide quench lines.

However, in developments to date, the reduction in cryogen consumption typically requires an increase in the complexity of the cooling system required to first cool the system from room temperature to its operating temperature and then keep it at operating temperature under different use cases.

Cryogenically cooled superconducting magnets have been employed in MRI systems have been based on bath cooled 'wet' systems such as described above with reference to FIG. 1, where the magnet coils are enclosed in a cryogen vessel immersed or partially immersed in liquid cryogen. Although recent proposals reduce the required volume of liquid cryogen from around 1000 liquid litres to a few hundred liquid litres, this is still a significant mass of cryogen and in case of a magnet quench or cooling failure, the cryogen is discharged and lost to atmosphere.

Certain proposed systems include pipe cooling arrangements where a much reduced quantity of cryogen—for example, in the range of tens of litres—is held in a cryogen reservoir which is smaller than the magnet coils and then is piped to the magnet coils using a network of small bore pipes and heat exchangers. Such pipe cooled arrangements are effective but complex which impacts manufacture time and cost.

Other proposed systems employ heat pipes which each contain a working cryogen fluid which is completely sealed in the pipe at manufacture which transports heat from one end of the pipe to the other by a continuous cycle of boiling and condensation. A problem with this arrangement is in that a number of heat pipes is required with different working gases to cover the whole range from room temperature to operating temperature.

Finally, fully conduction-cooled systems are possible but a large quantity of high-purity metal, for example aluminium or copper, is typically employed to allow the system to cool down from room temperature at a reasonable rate.

All the methods described above are either complex to assemble, expensive or both.

SUMMARY

The present disclosure addresses the above problems and accordingly provides efficient and low cost thermal buses for conduction cooling in cryogenic applications.

In particular, the present disclosure provides thermal buses for cryogenic applications with improved cooling efficiency without significantly increased system cost or complexity.

BRIEF DESCRIPTION OF THE FIGURES

The above, and further, objects, characteristics and advantages of the present disclosure will become more apparent from consideration of the following description of certain embodiments, given by way of non-limiting example only, in conjunction with the appended drawings wherein.

DETAILED DESCRIPTION

Figure 2:
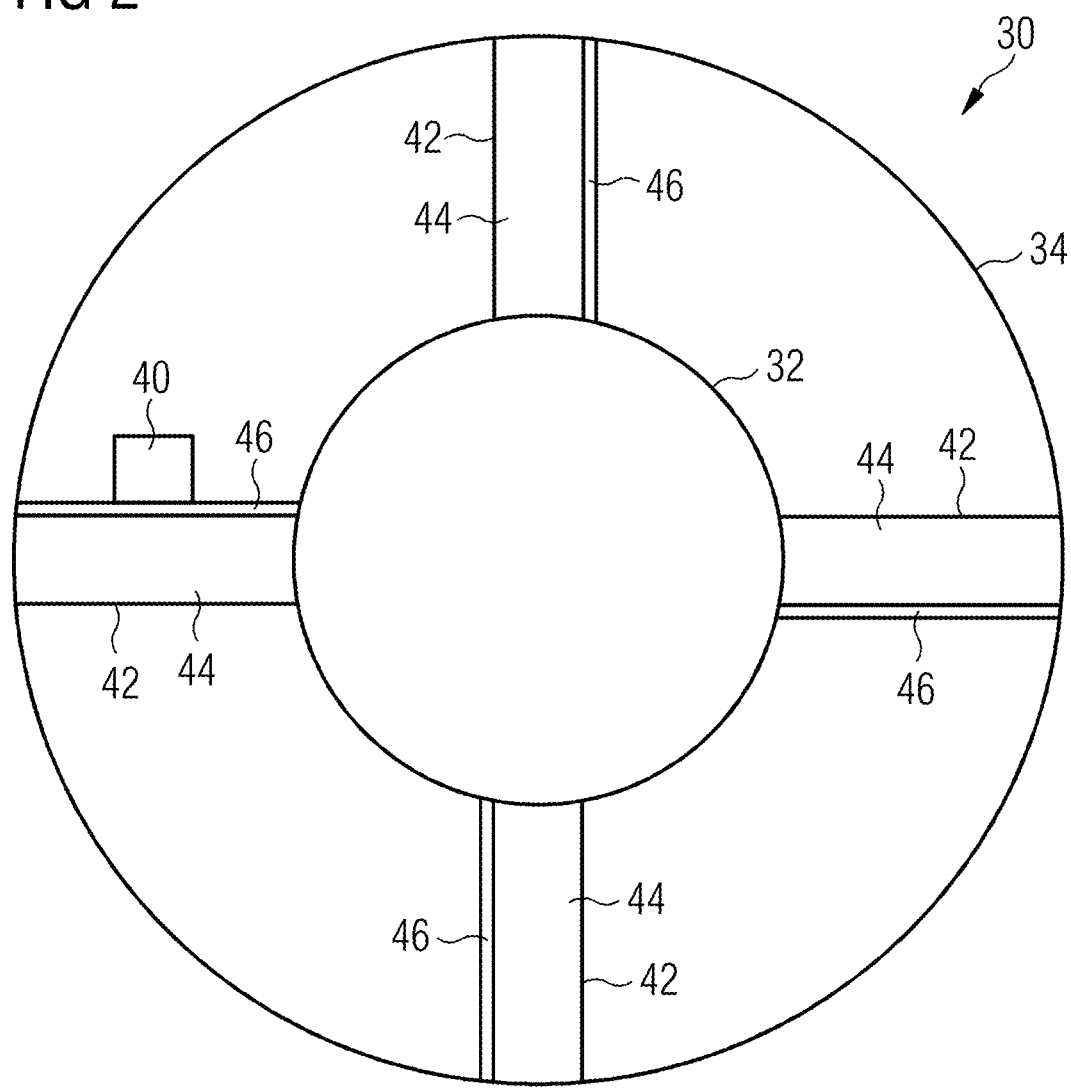
FIG. 2 schematically illustrates an improved thermal bus arrangement according to an embodiment of the present disclosure.

FIG. 2 illustrates a thermal bus according to an embodiment of the present disclosure in situ, within a superconducting magnet structure 30. In this embodiment, the magnet structure 30 comprises main coils 32 and shield coils 34. The shield coils 34 are concentric with the main coils 32 and are of larger diameter. A cooling station 40, thermally arranged to be cooled by a cryogenic refrigerator (not shown) is thermally linked to a thermal bus 42. The thermal bus 42 is thermally and mechanically linked to the main coils 32 and the shield coils 34 or other components which need to mechanically linked and cooled.

In the illustrated embodiment, a plurality of thermal bus parts 42 are located around the circumference of the magnet coils, each thermal bus part 42 being thermally and mechanically linked to one or other or both the main coils 32 and the shield coils 34.

In other embodiments, mechanical supports may be provided, mechanically linked to one or other or both the main coils 32 and the shield coils 34 but which are not arranged to perform as thermal bus parts of the present disclosure. Typically, each of the main coils 32 and the shield coils 34 are highly thermally conductive in the circumferential direction, and so act as thermal buses in themselves and transport heat from the body of the coil around the circumference to at least one thermal bus part 42 according to the present disclosure.

According to an aspect of the present disclosure, each thermal bus part 42 comprises a structural part 44 of high mechanical strength but low-to-average thermal conductivity and a high thermal conductivity part 46, which may be mechanically weak, and/or expensive, thermally in parallel with the structural part 44 along at least part of the length of the structural part 44. Preferably, the high thermal conductivity part 46 is in thermal contact with the cooling station 40, the structural part 44 and the magnet coils 32, 34. However, in certain embodiments, the high thermal conductivity part 46 may be in contact with only a subset of these.

Preferably, the structural parts 44 provide mechanical support to retain the main coils 32 and/or shield coils 34 or other parts in required relative positions. In some embodiments, the high thermal conductivity part 46 also provides an amount of mechanical support to the main coils 32 and/or shield coils 34. In other embodiments, the high thermal conductivity part 46 is just attached to the structural part 44 and provides no mechanical support. In yet further embodiments, the high thermal conductivity part 46 is only attached thermally in parallel with the structural part 44 and is not mechanically linked to the structural part 44 at all.

In the embodiment illustrated in FIG. 2, the cooling station 40 is thermally and mechanically attached to the structural part 44, which may be of a relatively low purity material such as 6061 aluminium alloy. The structural part 44 both mechanically retains the main coils 32 and shield coils 34 in required positions and provides a large cross-section area thermal path for cooling by thermal conduction from main coils 32 and/or shield coils 34 or other components to the cooling station 40. A relatively low purity material, such as 6061 aluminium alloy, should be chosen as the material for structural part 44 since it should have a relatively low material cost and should provide good mechanical strength. The material should also be chosen to have an acceptable thermal conductivity at temperatures close to room temperature and below.

For effective cool down from room temperature, a thermal connection of relatively large material cross-section is required between the main coils 32 and shield coils 34 and cooling station 40 to provide a sufficient thermal path for removing a significant heat energy from the main coils 32 and shield coils 34.

Typically, the thermal conductivity of an impure material reduces significantly at cryogenic temperatures. To provide the required thermal conduction at a temperature of 4K would require an excessive quantity of material to provide the required material cross-sectional area of the structural part 44 to keep the temperature drop along the thermal buses and between components low enough.

Therefore, according to an aspect of the present disclosure, a high thermal conductivity part 46 of relatively small cross-section is placed thermally in parallel with the structural part 44 of lower thermal conductivity. At cryogenic temperatures near the operating temperature of the superconducting magnet, the thermal conductivity of the high thermal conductivity part 46 will be much greater than the thermal conductivity of the material of the structural part. The required thermal conductance may be provided by a relatively small cross-section of high thermal conductivity material 46, although such small cross-section of high thermal conductivity material would be insufficient to provide the required mechanical support in the absence of structural part 44, and would be incapable of providing a required thermal conductance for cooling the main coils 32 and shield coils 34 from room temperature in a reasonable period of time.

The disclosure therefore provides a thermal bus 42 comprising a structural part 44 and a high thermal conductivity part 46 thermally in parallel with the structural part along at least part of its length, which high thermal conductivity part 46 has a material cross-section less than a material cross-section of the structural part 44.

Although the disclosure is not so limited, the following discussion will make reference to operation of a superconducting magnet at an operating temperature of 4K, using helium as the cryogen, using low purity 6061 aluminium alloy as the material of the structural part 44 and five-nines high purity aluminium as the material of the high thermal conductivity part 46.

On installation of the superconducting magnet, cooling of the magnet coils 32, 34 from room temperature requires removal of a large amount of heat to the cooling station 40. This may be initially done largely through the material of the structural member 44. As the system cools and reaches cryogenic temperatures, the thermal conductivity of the low thermal conductivity 6061 aluminium alloy reduces further. However, thermal conductivity of the high thermal conductivity aluminium does not reduce as significantly, or may even rise. During operation at 4K, the thermal conductivity of the high thermal conductivity aluminium significantly exceeds the thermal conductivity of the low thermal conductivity aluminium.

In a certain embodiment of the disclosure, strips of high thermal conductivity aluminium of relatively small material cross-section are added, thermally in parallel with the structural member 44. The strips of high thermal conductivity aluminium provide effective cooling of the superconducting magnet during operation, at or near operating temperature, yet these strips can be minimized in mass, so as to be capable of this purpose only but with minimal material cost and added mass.

Figure 3:
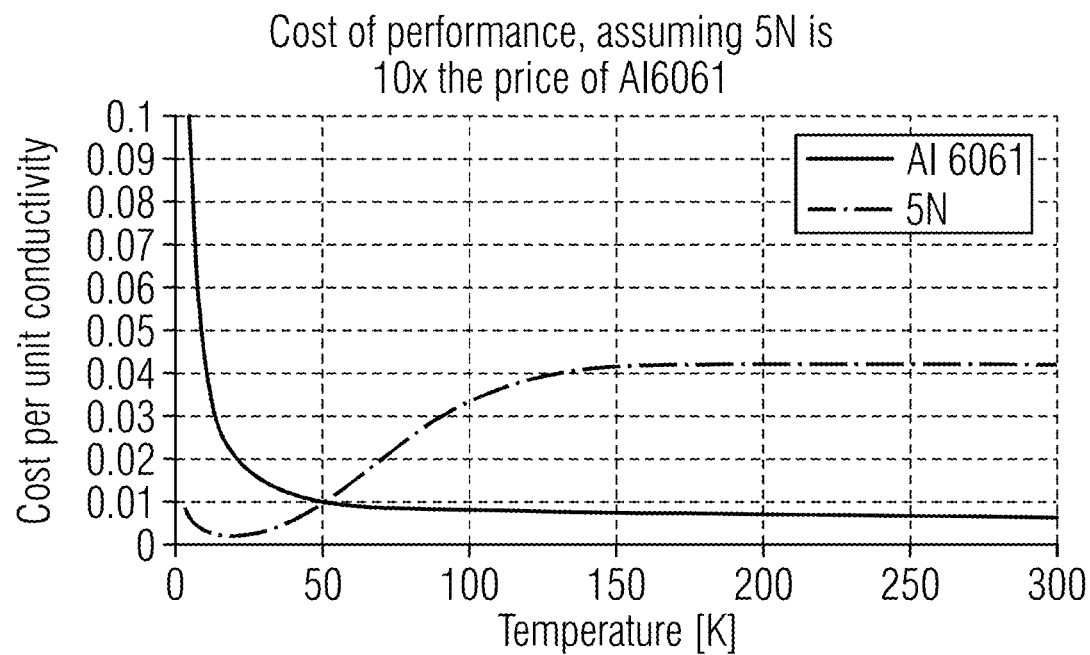
FIG. 3 illustrates the variation in thermal conductivity per unit cost, and absolute values of thermal conductivity, with varying temperature, of two grades of aluminium which may be employed in an embodiment of the present disclosure.
Figure 3:
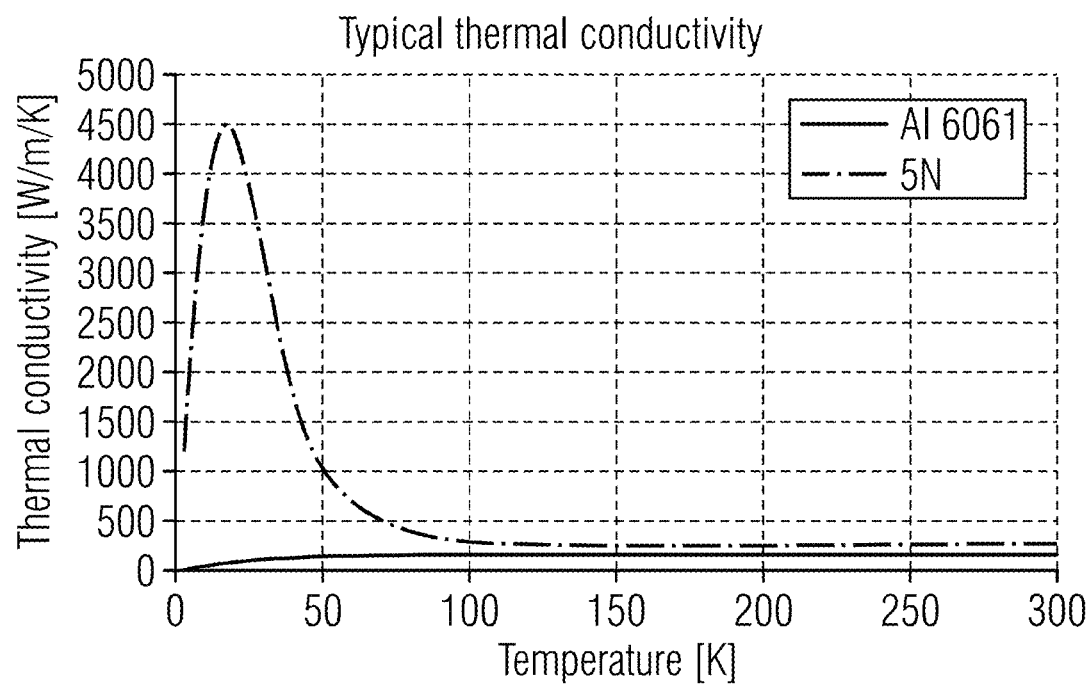

FIG. 3 illustrates the variation in thermal conductivity per unit cost, and absolute values of thermal conductivity, with varying temperature, of two grades of aluminium which may be employed in an embodiment of the present disclosure. At 'high' temperatures above 100K the thermal conductivity of the two are similar, so the low purity aluminium (in this example the material commonly referred to as "aluminium 6061") is consistently significantly cheaper per unit conductivity than the high purity aluminium (in this example, "five-nines" purity, meaning that it is at least 99.999% pure). At temperatures below about 100K, the thermal conductivity of 6061 aluminium deteriorates whilst the thermal conductivity of the high purity five-nines aluminium increases significantly. The cost per unit thermal conductivity accordingly increases with reducing temperature for aluminium 6061 but actually reduces for the high thermal conductivity five-nines aluminium. At temperatures below 20K the high thermal conductivity five-nines aluminium has a thermal conductivity more than ten times that of 6061 aluminium alloy, which more than makes up for its high price in terms of thermal conductivity per unit cost. At a certain temperature between 100K and 20K, the high thermal conductivity five-nines aluminium becomes cheaper per unit thermal conductivity than the 6061 aluminium, and this effect is exploited by the present disclosure in an aim to provide adequate thermal conductivity at minimum cost over the temperature range 300K-4K.

In preferred embodiments of the present disclosure, the superconducting magnet is cooled in a dry system, where no cryogen bath is provided for partial immersion of the magnet coils in liquid cryogen; and no cryogen-filled cooling loops are provided. Rather, the superconducting magnet is cooled by thermal conduction from cooling station 40 to a cryogenic refrigerator, though a solid thermal bus. Thermal conduction from the magnet coils to the cooling station is assured by the thermal bus of the present disclosure.

In dry magnets addressed by some embodiments of the present disclosure, there is no bath of cryogen or pipework to carry cryogen to remote parts of the magnet structure. Effective thermal buses are required to conduct heat from the magnet coils to a cryogenic refrigerator, particularly during cool-down from room temperature.

Figure 1:
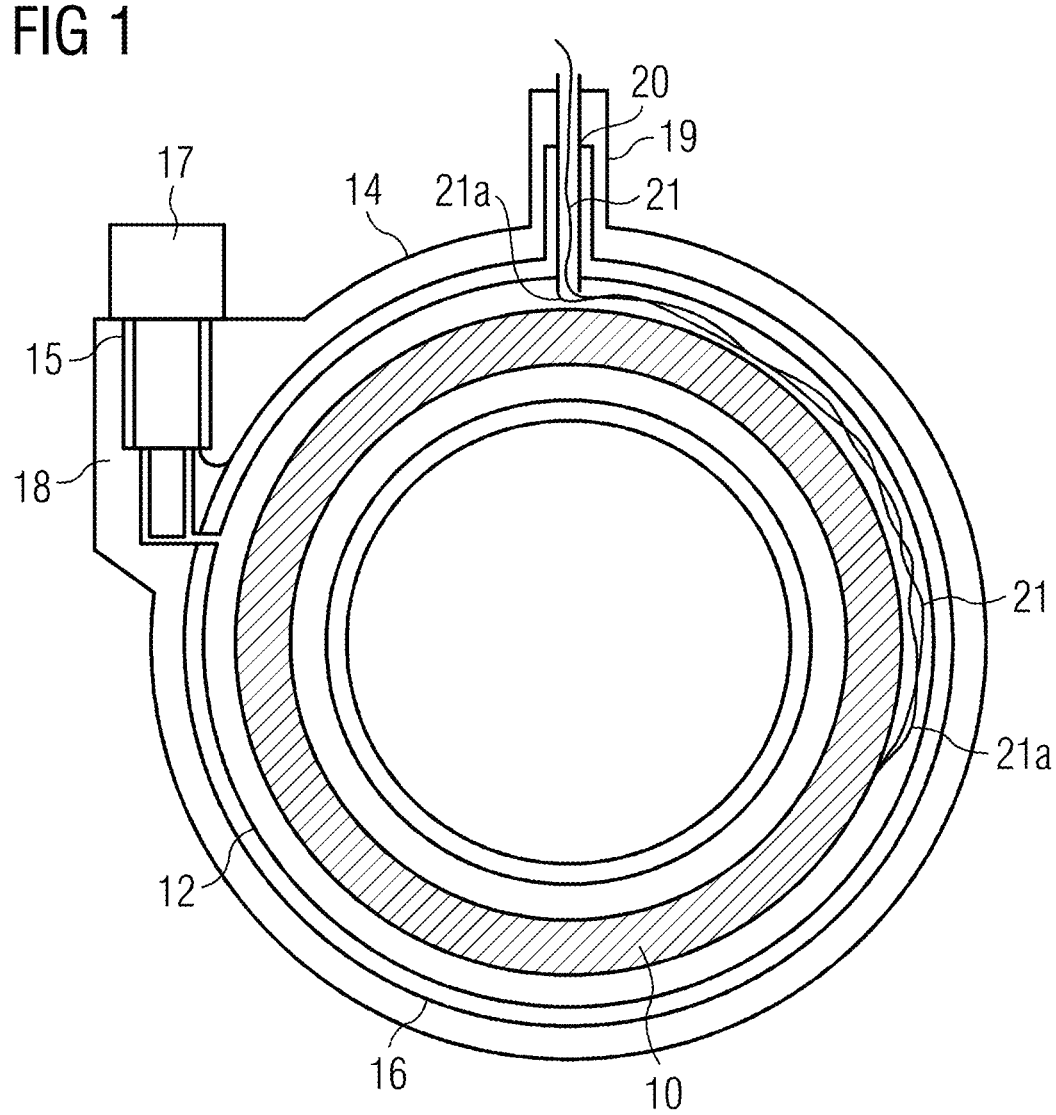
FIG. 1 schematically illustrates a known cryogenically cooled superconducting magnet arrangement in which magnet coils are at least partially immersed in a bath of liquid cryogen.

The present disclosure may be applied to employ components which are not structural, but which perform a different primary function, to have a secondary function as a thermal bus. In an embodiment, outer coil support members linking shield coils 34 are thermally connected to the shield coils 34 and main coils 32 of the magnet, where the coils 32, 34 perform a secondary function as large cross-section thermal buses with high circumferential thermal conductivity to bring the heat round towards cooling station 40. Of course, more than one cooling station 40 may be provided around the circumference of the magnet coils. Indeed, in some embodiments, a cooling station 40 may be provided on each radial thermal bus part 42. In the embodiment illustrated in FIG. 1, only one radial thermal bus part 42 has a cooling station 40 attached. The remainder of the magnet structure including coils 32, 34 and radial thermal bus parts 42, are cooled by thermal conduction around the circumference of the magnet coils.

In certain embodiments of the disclosure, a high thermal conductivity part, similar to the high thermal conductivity parts 46 discussed above, is provided thermally in parallel with the magnet coils. When the superconducting magnet is at operating temperature, the presence of the high thermal conductivity material does not decrease performance of the superconducting magnet.

The present disclosure employs structures that already exist within a cryogenic system as parts of a thermal bus, which may include a magnet coil itself, providing effective cooling by solid conduction to parts of the superconducting magnet which are remote from cooling station 40 over a full range of temperature from room temperature down to operating temperature at minimal cost. By adding a high thermal conductivity part 46 thermally in parallel with an existing structure, the present disclosure provides a thermal bus which is effective over the full range of temperature and at a reasonable cost. The costs formerly incurred in providing a dedicated thermal bus, for example in copper, may be saved, and the resultant thermal bus may be in any case be more effective at and near operating temperature than such known dedicated thermal bus.

Further, in the absence of this disclosure, the material required for the known dedicated thermal buses adds to the system mass and heat capacity. The saving of the cost and mass of the dedicated thermal buses may offset some of the cost of implementing the present disclosure.

In some embodiments of the present disclosure, a cryogen vessel may be provided. Typically, it will be smaller than a volume defined by the main coils 32 and shield coils 34. However, effective cooling of the magnet coils is still provided by solid thermal conduction through one or more thermal buses according to the present disclosure.

Typically, the material cross-section of the high thermal conductivity part 46 may be in the range 5-50% and preferably 10-20% of the material cross-section of the structural part 44. The material of the structural part 44 may have low purity, high yield modulus and high Young's modulus, which makes it suitable for structural parts. However, the material has low thermal conductivity at low (cryogenic) temperatures, which makes it unsuitable as a thermal bus at or near superconducting operating temperature. On the other hand, the material of the high thermal conductivity part 46 has a low yield modulus, meaning that it is relatively susceptible to plastic deformation, and a low Young's modulus, meaning that it is relatively susceptible to elastic deformation. Cost-effective conduction cooling is accordingly provided by an arrangement of a structural part 44 and a high thermal conductivity part 46 of relatively small material cross-section placed thermally in parallel with the structural part.

While the present disclosure has been described with reference to aluminium as the low thermal conductivity structural material and the high thermal conductivity material, embodiments of the present disclosure may employ other materials, such as high purity copper in the high thermal conductivity part, and stainless steel or cast iron in the structural part. In a particular example embodiment, the structural part 44 may be formed of low-purity aluminium while the high thermal conductivity part 46 is of high-purity copper.

Other suitable materials which may be selected include the following: For the structural part: Stainless steel; Aluminium: any alloy in 2xxx, 3xxx, 5xxx, 6xxx, 7xxx; Carbon fibre; Hardened copper.

For the high thermal conductivity part: High purity or highly annealed copper; Aluminium of 3N (99.9%) purity or above; Many single crystal or highly annealed materials.

1xxx series aluminium could be used in either category, provided that it is paired with a material of suitable different thermal conductivity.

In certain embodiments of the present disclosure, the high thermal conductivity part 46 may be omitted and the structural part 44 alone used as a thermal bus. Such embodiments employ the material of existing structures as thermal buses and eliminate or reduce the requirement for dedicated thermal buses, and so may enable a reduction in material cost and mass associated with known thermal bus provision.

In any case, good thermal contact should be ensured between the structural parts 44 used as thermal buses and parts to be cooled, such as superconducting coils, which may not typically be the case.

While the present disclosure has particularly described the use of high-purity materials and low-purity materials respectively as the high thermal conductivity material and the low thermal conductivity material, other types of high thermal conductivity materials may be prepared, for example by thermal or mechanical annealing.

The present disclosure accordingly provides use of structural components of low thermal conductivity material as part of a thermal bus. During magnet cool-down from room temperature, the high thermal conductivity part 46 does not carry much thermal energy transfer, as it is of smaller material cross-section than the structural part 44, and of similar thermal conductivity. Once the majority of the heat energy has been removed from the superconducting magnet, for example once the temperature of the superconducting magnet reaches a cryogenic temperature such as 20K, the low purity materials have a much lower thermal conductivity than the high purity materials, and the high thermal conductivity part 46 becomes more thermally conductive than the structural part 44 even though it is of much smaller material cross-section. The amount of high purity material and therefore the associated material costs can be minimized by utilizing the material of structural components for the initial cool down from room temperature. Structural members, by their nature, often have a significant cross-sectional area which provides a thermal path of high thermal conductance for temperatures near room temperature. In preferred examples, structural members made of aluminium are found to be effective, as they have high thermal conductivity but low heat capacity per unit volume, therefore requiring little heat removal to cool them.

In certain embodiments of the present disclosure, the material of the superconducting coils is used as a thermal bus for cooling other components within the superconducting magnet. In such embodiments, the requirement for specific thermal buses is reduced and cool-down time is reduced. Since the superconducting coils typically have a very large cross-section and conductivity so they are very efficient buses.

In other embodiments of the present disclosure, the high thermal conductivity part 46 may be in the form of a heat pipe, itself comprising an elongate thermally conductive structure encasing a mass of cryogen. The materials selected for the elongate thermally conductive structure and the cryogen may be optimised to provide a required thermal conduction over a temperature range at which the structural part 44 provides insufficient thermal conduction.

The invention claimed is:

1. A superconducting magnet device, comprising:
a plurality of superconducting magnet coils;
a structural part mechanically and thermally linked to respective magnet coils to retain the magnet coils in respective relative positions;
a cooling station thermally connected to a cryogenic refrigerator and to the structural part,
wherein a thermally conductive path, which passes through the structural part, is established between the cryogenic refrigerator and the superconducting magnet coils; and
a thermal bus part, comprising:
the structural part, which is composed of a first material of first thermal conductivity; and
a high thermal conductivity part of a second material of second thermal conductivity provided thermally in parallel with the structural part along at least part of its length, the second material having greater thermal conductivity than the first material,
wherein, at room temperature, the structural part has a greater thermal conductance than the high thermal conductivity part, and, at an operating temperature of the superconducting magnet device, the structural part has a lower thermal conductance than the high thermal conductivity part.

2. A superconducting magnet device according to claim 1, wherein the high thermal conductivity part is in thermal contact with at least a subset of the cooling station, the structural part, and the magnet coils.

3. A superconducting magnet device according to claim 1, wherein the structural part provides mechanical support to the magnet coils.

4. A superconducting magnet device according to claim 1, wherein the high thermal conductivity part provides mechanical support to the magnet coils.

5. A superconducting magnet device according to claim 1, wherein the high thermal conductivity part is mechanically linked to the structural part.

6. A superconducting magnet device according to claim 1, wherein a material cross-sectional area of the high thermal conductivity part is between 5-50% of the material cross-sectional area of the structural part.

7. A superconducting magnet device according to claim 6, wherein a material cross-sectional area of the high thermal conductivity part is between 10-20% of the material cross-sectional area of the structural part.

8. A superconducting magnet device according to claim 1, wherein the first material has a yield modulus and a Young's modulus respectively greater than a yield modulus and a Young's modulus of the second material.

9. A superconducting magnet device according to claim 1, wherein at least one of the magnet coils is provided with a high thermal conductivity part of a material of higher thermal conductivity than the thermal conductivity of the magnet coil, thermally in parallel with the magnet coil.

10. A superconducting magnet device, comprising:
a plurality of superconducting magnet coils;
a structural part mechanically and thermally linked to respective magnet coils to retain the magnet coils in respective relative positions; and
a cooling station thermally connected to a cryogenic refrigerator and to the structural part,
wherein a thermally conductive path, which passes through the structural part, is established between the cryogenic refrigerator and the superconducting magnet coils; and
a thermal bus part, comprising:
the structural part, which is composed of a first material of first thermal conductivity; and
a high thermal conductivity part having a heat pipe, which has an elongate thermally conductive structure encasing a mass of cryogen, provided thermally in parallel with the structural part along at least part of its length,
wherein, at room temperature, the structural part has a greater thermal conductance than the high thermal conductivity part, and, at an operating temperature of the superconducting magnet device, the structural part has a lower thermal conductance than the high thermal conductivity part.

11. A superconducting magnet device according to claim 10, wherein the high thermal conductivity part is in thermal contact with at least a subset of the cooling station, the structural part, and the magnet coils.

12. A superconducting magnet device according to claim 10, wherein the structural part provides mechanical support to the magnet coils.

13. A superconducting magnet device according to claim 10, wherein the high thermal conductivity part provides mechanical support to the magnet coils.

14. A superconducting magnet device according to claim 10, wherein the high thermal conductivity part is mechanically linked to the structural part.

15. A superconducting magnet device according to claim 10, wherein at least one of the magnet coils is provided with a high thermal conductivity part of a material of higher thermal conductivity than the thermal conductivity of the magnet coil, thermally in parallel with the magnet coil.

* * * * *